United States Patent [19]

Ohta et al.

[11] Patent Number: 4,822,441

[45] Date of Patent: Apr. 18, 1989

[54] PLASTIC MOLD DECAPSULING APPARATUS

[75] Inventors: Hiroyuki Ohta; Naoki Yoshida; Hideo Goto, all of Tokyo, Japan

[73] Assignees: Nippon Scientific Co., Ltd.; Kusumoto Chemicals Co., Ltd., both of Japan

[21] Appl. No.: 198,230

[22] Filed: May 25, 1988

[30] Foreign Application Priority Data

May 26, 1987 [JP] Japan .............................. 62-78238[U]
May 26, 1987 [JP] Japan .............................. 62-127172
May 26, 1987 [JP] Japan .............................. 62-127173
May 28, 1987 [JP] Japan .............................. 62-129869

[51] Int. Cl.$^4$ .......................... B44C 1/22; B29C 37/00; C03C 15/00; C03C 25/06

[52] U.S. Cl. .................................. 156/345; 156/640; 156/655; 156/668

[58] Field of Search ............... 156/345, 640, 654, 668, 156/655, 344, 584; 134/27, 105, 198; 437/225

[56] References Cited

U.S. PATENT DOCUMENTS 4,344,809 8/1982 Wensink .............................. 156/345

4,359,360 11/1982 Harris et al. ........................ 156/345

Primary Examiner—William A. Powell
Attorney, Agent, or Firm—Wigman & Cohen

[57] ABSTRACT

The plastic mold decapsuling apparatus comprises an etchant bottle; a heat tank; an etchant reservoir disposed in the heat tank; at least one decapsuling plastic mold holder; a first etchant feeding pump for selectively circulating the etchant from the etchant bottle to the etchant reservoir and discharging waste etchant; and a second etchant feeding pump for feeding the etchant from the reservoir to the plastic mold holder. Since the etchant bottle can be set as it is without transferring the etchant into another vessel, the etchant handling work is safe. Since a required amount of etchant can previously be heated in a reservoir within the heat tank, it is possible to continuously supply a predetermined amount of etchant heated to a constant temperature, thus improving the speed of decapsuling work. Futher, since the etchant is circulated through the decapsuling plastic mold holder, it is possible to firmly decapsule plastic mold devices by use of a relatively mild etchant such as fuming nitric acid.

9 Claims, 2 Drawing Sheets

PLASTIC MOLD DECAPSULING APPARATUS

BACKGROUND OF THE INVENTION

1. Field of the Invention

The present invention relates generally to a plastic mold decapsuling apparatus, and more specifically to an apparatus which can dissolve a joint surface of a plastic mold or resin capsuled device such as semiconductor chip, capacitor, hybrid integrated circuit, etc. in order to inspect causes of defectiveness of the device.

2. Description of the Prior Art

To decapsule a plastic mold device by use of an etchant, coventionally; (A) etchant is taken from an etchant bottle through a pipette by an inspector and then put into a small recess formed in the plastic mold device; (B) etchant is transferred from an etchant bottle to a beaker, and then a plastic mold device is dipped into the etchant within the beaker; and (C) etchant is transferred from an etchant bottle to a special etchant reservoir and then sucked to the plastic mold device through a pipe provided for a decapsuling apparatus.

In these prior-art decapsuling methods, however, since etchant such as fuming nitric acid or concentrated sulfuric acid is transferred from an etchant bottle to another vessel, there exists a problem in that corrosive or irritant gas is produced and therefore the environment is contaminated.

When concentrated sulfuric acid is used as etchant, it is necessary to heat the etchant to about 290° C. by a heating tank disposed between an etchant storage tank and a decapsuling plastic mold holder. As the method of heating an etchant by the heating tank, two methods can be considered. That is, a quantity of etchant used for one mold device is heated or a quantity of etchant used for several mold devices is heated at a time. In the former method, an addition of etchant heating time and etchant feeding time is required. On the other hand, in the latter method, a long time is required to heat the etchant at a time. In both cases, when several mold devices are to be decapsulated, there exists a problem in that it takes a relatively long etchant heating time. Further, since the etchant is a dangerous liquid, it is not preferable to heat a large quantity of etchant within the heat tank at a time.

When concentrated sulfuric acid is used as etchant, since the reactive force against the plastic mold device is strong, only a pressure reduction pump is usable, and the etchant is jetted to the decapsuling portion of the plastic mold device.

On the other hand, when fuming nitric acid is used as etchant, since the reactive force against the plastic mold device is mild, there exists a problem in that the pressure reduction pump is not usable because a large quantity of nitric acid is required. Further, it is necessary to circulate the etchant so as to be firmly applied to the decapsuling portion of the plastic mold device.

As the prior-art plastic mold decapsuling apparatus, U.S. Pat. No. 4,344,809 by Wensink, entitled JET ETCH APPARATUS FOR DECAPSULATION OF MOLDED DEVICES is incorporated herein by reference.

SUMMARY OF THE INVENTION

With these problems in mind, therefore, it is the primary object of the present invention to provide a plastic mold decapsuling apparatus which can directly feed etchant from an etchant bottle to a decapsuling plastic mold holder without transferring etchant from the bottle to another vessel, thus eliminating dangerous etchant handling procedure and preventing environment contamination.

It is another object of the present invention to provide a plastic mold decapsuling apparatus which can continuously heat a required amount of etchant in the etchant feed passage between an etchant bottle and a decapsuling plastic mold holder without accumulating etchant, thus reducing apparatus space and etchant heating space.

It is still another object of the present invention is to provide a plastic mold decapsuling apparatus which can stably recirculate a mild etchant so as to be firmly applied to a decapsuling portion of a plastic mold device for reduction of decapsuling time.

To achieve the above-mentioned object, a plastic mold decapsuling apparatus of the present invention, comprises: (a) an etchant bottle for containing an etchant to decapsule a capsuled plastic mold; (b) a heat tank for containing a heating medium kept at a constant temperature; (c) an etchant reservoir, disposed within said heat tank, for containing a predetermined amount of the heated etchant; (d) at least one decapsuling plastic mold holder for holding a plastic mold to be decapsuled; (e) first etchant feeding means for selectively feeding a predetermined amount of the etchant from said etchant bottle to said etchant reservoir and waste etchant from said decapsuling plastic mold holder to outside; and (f) second etchant feeding means, disposed within said heat tank, for circulating the etchant in said etchant reservoir through said decapsuling plastic mold holder.

In the plastic mold decapsuling apparatus, since an etchant bottle can be used as it is without transferring etchant to another vessel, it is possible to make safe the etchant handling work without producing a corrosive irritant gas.

Further, since a desired quantity of etchant can previously be heated in an etchant reservoir within a heating tank, it is possible to continuously supply a stably heated etchant required for a single decapsuling work.

Further, since a gear pump or a plunger pump is used for the second etchant feeding means, it is possible to stably circulate etchant to a plastic mold device and therefore the decapsuling time can be reduced. Therefore, it is possible to reduce the quantity of etchant to be consumed.

BRIEF DESCRIPTION OF THE DRAWINGS

The features and advantages of the plastic mold decapsuling apparatus according to the present invention will be more clearly appreciated from the following description of the preferred embodiment of the invention taken in conjunction with the accompanying drawings in which.

DETAILED DESCRIPTION OF THE PREFERRED EMBODIMENTS

Figure 1:
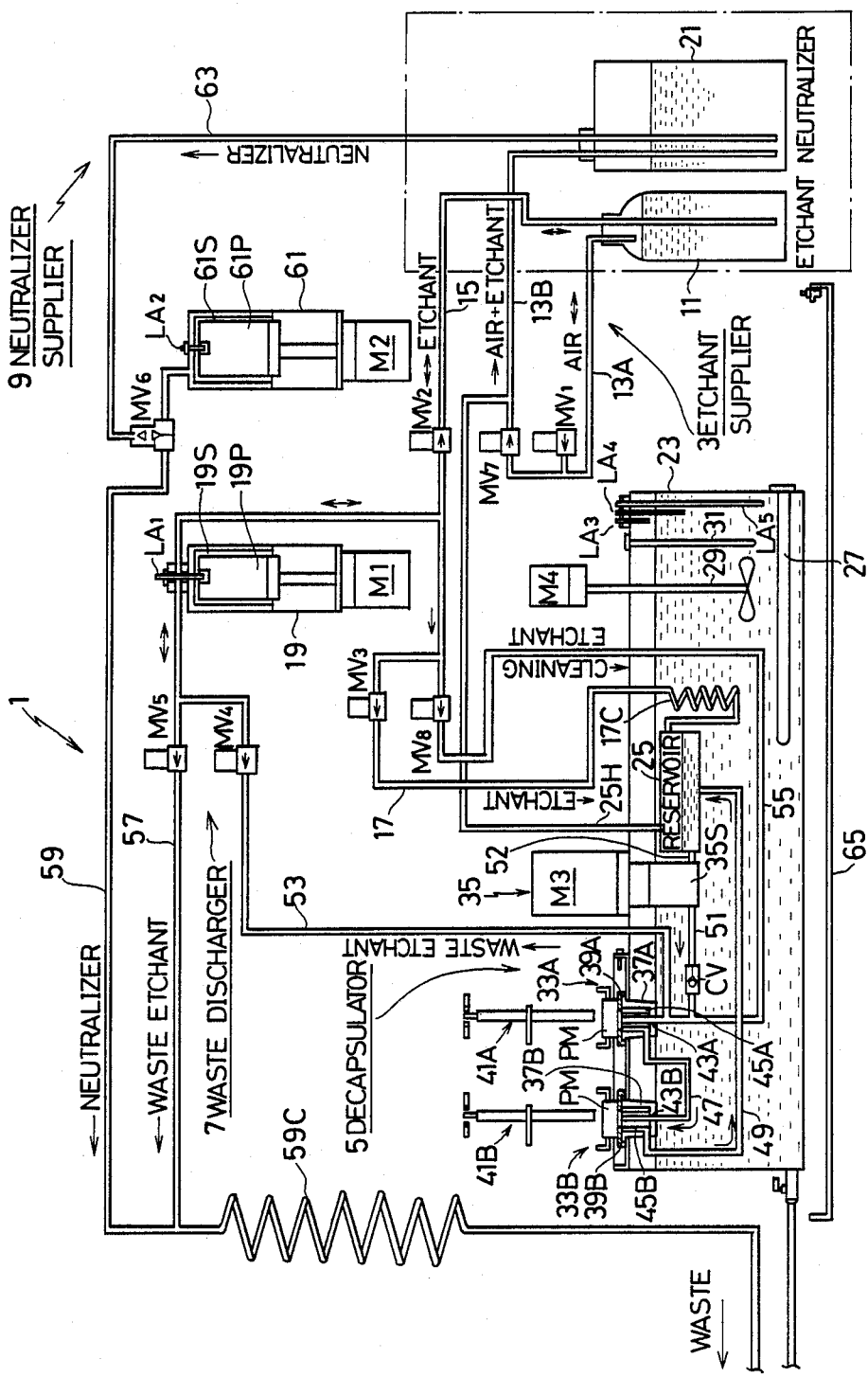
FIG. 1 is a diagrammatical illustration for assistance in explaining a plastic mold decapsuling apparatus of the present invention.

FIG. 1 shows an embodiment of the plastic mold decapsuling apparatus of the present invention. The apparatus 1 comprises roughly means 3 for supplying etchant as fuming nitric acid, concentrated sulfuric acid, etc. (etchant supplier); means 5 for decapsuling plastic mold devices by feeding etchant from the etchant supplying means 3 (decapsulator); means 7 for discharging waste etchant produced by the decapsuling means 5 (waste discharger); and means 9 for supplying neutralizer to the waste etchant discharging means 7 (neutralizer supplier).

The etchant supplying means 3 comprises an etchant bottle 11 now on the market; a first plunger pump 19 having a plunger 19P driven by a motor Ml; and some etchant feed pipes and open/close valves MV. One of the feature of the present invention is to use an etchant bottle as it is without transferring etchant in a bottle to another vessel or container. The etchant is fuming nitric acid, concentrated sulfuric acid, etc. An air bleed pipe 13A introduces air into the etchant bottle 11; two etchant feed pipes 15 and 17 feed etchant in the bottle 11 to the decapsuling means 5.

The decapsuling means 5 comprises a heating tank 23 having a heating unit 27, an agitator 29, a temperature sensor 31, three liquid level sensors LA3, LA4 and LA5; an etchant reservoir 25, a gear pump 35; two decapsuling plastic mold holders 33A and 33B; two mold support rods 41A and 41B; a check valve CV; and some etchant feed pipes.

The waste etchant discharging means 7 comprises the first plunger pump 19 used in common with that for the etchant supplying means 3; a spiral pipe 59C; and some waste etchant feed pipes and open/close valves MV.

The neutralizer supplying means 9 comprises a neutralizer bottle 21, a second plunger pump 61 having a plunger 61P driven by a motor M2; and some neutralizer feed pipes.

The apparatus will be described in more detail.

The etchant bottle 11 communicates with one end of the air bleed pipe 13A and one end of the etchant feed pipe 15. An air valve MV1 for introducing outside air to the etchant bottle 11 is connected to the air bleed pipe 13A.

The neutralizer bottle 21 communicates with one end of the air feed pipe 13B and one end of the neutralizer feed pipe 63.

The other end of the air bleed pipe 13A is connected to the other end of the air feed pipe 13B via an air valve MV7. The other end of the etchant feed pipe 15 is connected to a cylinder chamber 19S of the first plunger pump 19 via the valve MV2 and an end of the etchant feed pipe 17 via an etchant valve MV3. The other end of the pipe 17 is connected to the etchant reservoir 25 disposed in the heating tank 23 via a spiral pipe 17C.

The first plunger pump 19 is composed of a cylinder chamber 19S, a plunger 19P reciprocated within the cylinder chamber 19S, and a driving motor Ml for reciprocating the plunger 19P. A liquid detection switch LA1 is disposed on the upper wall of the cylinder chamber 19S to detect that a predetermined amount of etchant is supplied into the cylinder chamber 19S. Further, these valves MV1, MV7, MV2 and MV3 are opened or closed in linkage with the motion of the first plunger pump 19.

The operation of the etchant supplier 3 will be described. When the first plunger pump 19 is driven to move the plunger 19p downward with valves MV1 and MV2 open and MV3 closed, outside air is introduced from the valve MV1 to the etchant bottle 11 through the air bleed pipe 13A. On the other hand, etchant within the bottle 11 is introduced into the cylinder chamber 19S together with air through the etchant feed pipe 15. Under these conditions, when the plunger 19P is moved upward, the air is returned to the etchant bottle 11 through the etchant feed pipe 15. Further, at this moment, when the valve MV7 is opened and the valve MV1 is closed, etchant and air are fed to the neutralizer tank 21 to mix the etchant with the neutralizer by bubbling mixture.

Thereafter, when the valve MV1 is opened again and the plunger pump 19P is moved again downward by driving the motor Ml, since air has already been removed from the etchant feed pipe 15 and the cylinder chamber 19S, a predetermined amount of etchant can be introduced into the cylinder chamber 19S via the etchant pipe 15 and the detection switch LA1.

When the plunger 19P is moved upward with the valve MV2 closed and the valve MV3 open, a predetermined amount of etchant introduced into the cylinder chamber 19S is fed via the etchant feed pipe 17 to the etchant reservoir 25 disposed within the heating tank 23 of the decapsulator 5, via a spiral pipe 17C.

As described above, the etchant bottle 11 including fuming nitric acid or concentrated sulfuric acid can be used as the etchant supplier 3 as it is. Since it is unnecessary to transfer etchant to another etchant vessel as is conventional, it is possible to eliminate a dangerous chemicals transferring work, thus improving the safety. Further, when the etchant bottle 11 is emptied, the used bottle 11 is replaced with a new one, thus improving the work efficiency.

In addition, when fuming nitric acid is used as the etchant, although corrosive gas is produced, since the corrosive gas can be collected into the neutralizer bottle 21 through the pipes 13A and 13B, it is possible to prevent the environment from contamination or to prevent other peripheral equipment from corrosion.

Further, since etchant are fed from the etchant bottle 11 to the decapsulator 5, after air has been removed from the pipe 15 and the cylinder chamber 19S of the first plunger pump 19, it is possible to smoothly feed a desired amount of etchant.

Furthermore, since a predetermined amount of etchant can be fed to the decapsulator 5 (required for one task) without feeding a large amount of etchant at the same time, it is possible to minimize an accident in case etchant leaks from the decapsulator 5.

The decapsulator 5 including the decapsuling plastic mold holders 33A and 33B will be described hereinbelow in more detail. Where fuming nitric acid is used as etchant, the heating tank 23 is filled with water. The water in the heating tank is heated by a heater unit 27 and kept at temperature about 60° C., for instance. To make uniform the temperature distribution within the heating tank 23, the agitator 29 driven by a motor M4 is provided. To keep the temperature within the heating tank 23 at a constant value, the temperature sensor 31 is provided in the tank 23.

On the other hand, where concentrated sulfuric acid is used as etchant, oil is put into the heating tank 23 in place of water nd kept at a higher temperature.

The etchant feed pipe 17 communicates with the etchant reservoir 25 disposed within the heating tank 23 through a spiral pipe 17C serving as a heat exchanger. Therefore, etchant of a predetermined amount introduced from the etchant bottle 11 to the cylinder chamber 19S is heated and fed to the etchant reservoir 25 via the pipe 17 formed with the spiral pipe 17C placed within the heating tank 23. The liquid level sensors LA3, LA4 and LA5 are disposed on the right side wall in order to detect the height of the liquid surface level within the heating tank 23.

Since the etchant can be heated quickly when being fed from the bottle 11 to the reservoir 25 through the spiral portion 17C of the etchant feed pipe 17, it is possible to markedly reduce the etchant feeding and heating time. Further, since no independent heating tank is additionally provided, it is possible to reduce the size of the apparatus.

Further, since only a required amount of etchant solution corresponding to one task is supplied to the etchant reservoir 25, in case etchant solution leaks, the etchant solution can be diluted within the heating tank 23, so that it is possible to prevent dangerous accident due to powerful medicine.

To introduce etchant within the etchant reservoir 25 to a single or plural decapsuling plastic mold holders 33A and 33B, the decapsulator 5 comprises a gear pump 35. This gear pump 35 is disposed at the upper middle portion of the heating tank 23. The operating unit 35s of the gear pump 35 is dipped within the heating tank 23 and driven by a driving motor M3.

The first and second decapsuling holders 33A and 33B include first and second decapsuling chambers 37A and 37B, respctively. A plastic mold of semiconductor chip device to be decapsuled is placed upside down on first and second mounting bases 39A and 39B respectively and fixed by first and second device support rods 41A and 41B, respectively.

The first decapsuling chamber 37A is provided with a first inner cylindrical tube 43A and a first outer cylindrical tube 45A. The second decapsuling chamber 37B is provided with a second inner cylindrical tube 43B and a second outer cylindrical tube 45B. The etchant reservoir 25 is connected to the first inner cylindrical tube 43A via the gear pump 35 and a check valve CV through the pipes 51 and 52; the first outer cylindrical tube 45A is connected to the second inner cylindrical tube 43B via the pipe 47; the second outer cylindrical tube 45B is connected to the bottom of the etchant reservoir 25 via the pipe 49.

Further, one end of a pipe 53 is connected to a point between the first inner cylindrical tube 43A and the check valve CV; the other end of the pipe 53 is connected to the cylinder chamber 19S of the first plunger pump 19; and a valve MV4 is connected between the first inner cylindrical tube 43A and the first plunger pump 19. This valve MV4 is opened/closed in linkage with the first plunger pump 19.

The operation of the decapsulator 5 will be described hereinbelow:

When the gear pump 35 is driven by the motor M3, the operating unit 35S of the gear pump 35 feeds etchant temporarily stored in the etchant reservoir 25 to the first inner cylindrical tube 43A via the tubes 52 and 51 and the check valve CV. Therefore, etchant is jetted upward from the inner cylindrical tube 43A toward a plastic mold device for decapsuling treatment. The jetted etchant is dropped to the first outer cylindrical tube 45A and then to the second inner cylindrical tube 43B via the pipe 47.

Therefore, etchant is further jetted upward from the second inner cylindrical tube 43B toward another plastic mold device for additional decapsuling treatment. The jetted etchant is dropped to the second outer cylindrical tube 45B and then returned to the etchant reservoir 25 via the pipe 49.

As described above, the two plastic mold devices PM mounted on the decapsuling holders 33A and 33B can be decapsuled after the gear pump 35 has been actuated for a predetermined time period. The treatment time, that is, the time during which the gear pump 35 is operated depends upon the kind of etchant, the size of the plastic mold device PM, the degree of decapsuling treatment.

In the above description, since the pumping unit 35S of the gear pump 35 is dipped in the heating tank 23 and kept at a predetermined temperature, it is possible to circulate and jet etchant toward the decapsuling devices at a constant temperature.

Further, even when etchant leaks from the pumping unit 35S of the gear pump 35, since the leaked etchant can be diluted in the heating tank 23 without being discharged to the outside, it is possible to improve the safety in handling the powerful etchant.

The reason why the gear pump 35 is adopted to circulate etchant to the decapsuling holders 33A and 33B is that the gear pump is high in etchant jetting pressure, accurate in etchant supply quantity, high in response speed, and therefore the decapsuling treatment time can be reduced.

In addition, since the etchant jet pressure can be increased, it is possible to simultaneously jet etchant to several plastic devices to be decapsuled, thus increasing decapsuling efficiency. When fuming nitric acid (the reaction power is moderate) is used as the etchant, the simultaneous decapsuling operation is particularly effective by circulating the etchant through the decapsuling holders 33A and 33B.

Further, it is also possible to feed etchant in the reverse direction from the etchant reservoir 25 to the decapsuling holders 33B and 33A through the pipe 49 by reversely driving the gear pump 35. In this case, the used etchant is returned to the etchant reservoir 25 via the pipe 51 through the reversed check valve VC on the basis of the etchant circulation caused by the operating unit 35S of the gear pump 35. In this reverse circulation method, air introduced when the plastic device is decapsuled is effectively sucked into the etchant reservoir 25.

When the gear pump 35 is stopped after decapsuling treatment, the used etchant is once collected into the etchant reservoir 25.

The cleaning operation of the decapsuling holders 33A and 33B will be described hereinbelow.

A pipe 55 is connected between the first inner cylindrical tube 43A and the pipe 17 via a valve MV8 at a point located between the two valves MV2 and MV3. This valve MV8 is opened or closed in linkage with the first plunger pump 19.

After waste etchant has once been collected into the etchant reservoir 25 after decapsuling treatment, new etchant is introduced into the cylinder chamber 19S from the etchant bottle 11 by driving the motor M1 of the first plunger pump 19 to move the plunger 19P in the downward direction with the valve MV2 open. Thereafter, when the plunger 19P is moved upward with the valve MV2 closed and MV8 open (the valve MV3 is kept closed), the new etchant introduced into the plunger 19S is fed to the decapsuling holders 33A and 33B via the pipe 55 and then collected to the etchant reservoir 25 via the pipe 49.

By feeding etchant through the decapsuling holders 33A and 33B, it is possible to wash away dissolved substances adhered onto the surfaces of the two encapsuling chambers 37A and 37B, the two inner cylindrical tubes 43A and 43B, the two outer cylindrical tubes 45A and 45B, the decapsuled surface of the mold devices PM, and the inner surfaces of the pipes.

As already described, where fuming nitric acid is used as etchant, it is preferable to heat the decapsuling etchant at temperature 60° to 70° C. in order to increase the etchant speed. In this case, it is preferable to heat the cleaning etchant at temperature about 50° C. in order to enhance the cleaning effect.

The operation of waste dischanger 7 will be described hereinbelow.

The waste etchant collected in the etchant reservoir 25 can be introduced into the cylinder chamber 19S via the pipe 53 when the first plunger pump 19 is operated to move the plunger 19P downward with the valve MV4 and the check valve CV open.

Further, a pipe 57 is connected between a spiral neutralizer mixing pipe 59C and the first plunger chamber 19S via a valve MV5. Further, a pipe 59 is connected between the spiral neutralizer mixing pipe 59C and the second plunger chamber 61S of the second plunger pump 61 via a valve MV6. This second plunger pump 61 is driven by a driving motor M2. Another pipe 63 is connected between the valve MV6 and the neutralizer bottle 21.

When the valve MV6 is actuated in the downward direction, for instance and further the second plunger 61P is moved downward, neutralizer in the neutralizer bottle 21 is introduced into the cylinder chamber 61S via the pipe 63 without feeding the neutralizer via the pipe 59. In contrast with this, when the valve MV6 is deactuated in the upward direction, for instance and further the second plunger 61P is moved upward, neutralizer in the cylinder chamber 61S is fed via the pipe 59 without returning the neutralizer via the pipe 63. In the above operation, the valve MV6 is activated or deactivated in linkage with the second plunger pump 61.

The neutralizer stored in the neutralizer bottle 21 is an alkaline neutralizing agent such as sodium carbonate or diluent such as water.

Further, a pipe 25H is connected between the upper surface of the etchant reservoir 25 and the neutralizer bottle 21 via the pipe 13B, so that gas generated in the reservoir 25 can be discharged after being neutralized through the neutralizer bottle 21.

When the first plunger 19P is moved upward with the valve MV4 closed and MV5 open, the waste etchant solution introduced into the first cylinder chamber 19S is fed through the pipe 57 and the spiral pipe 59C opened to the air.

On the other hand, when the second plunger 61P is moved downward by driving the motor M2 with the valve MV6 actuated, a predetermined amount of neutralizer in the neutralizer bottle 21 is introduced into the second cylinder chamber 61S via the pipe 63. Thereafter, when the second plunger 61P is moved upward by driving the motor M2 with the valve MV6 deactuated, the neutralizer in the cylinder chamber 61S is fed through the pipe 59. In the above operation, since both the first and second plungers 19P and 61P are moved upward in synchronism with each other, waste etchant solution fed through the pipe 57 and neutralizer or water fed throggh the pipe 59 are mixed with each other in the spiral pipe 59C and therefore neutralizer or diluted before being discharged outside. Therefore, it is possible to discharge the waste etchant solution without contaminating the environment.

Further, in FIG. 1, the reference numeral 65 denotes a liquid saucer disposed under the heating tank 23 for receiving leaked etchant or liquid. Further, the first and second plunger pumps 19 and 61 are operated by detecting plunger position by use of microswitches. Further, in the above embodiment, the gear pump 35 is used. However, without being limited thereto, it is also possible to use a high pressure hydraulic pump. Further, etchant is jetted to a plastic mold device in the above embodiment. However, it is also possible to dip plastic mold device in circulating etchant for decapsuling treatment. Furthermore, it is possible to use vapor etchant or vapor-liquid mixture etchant in place of the liquid etchant.

Further, it is also possible to use heated air, heated metal powder or a heated solid medium in stead of the heated liquid within the heating tank.

The decapsuling procedure will be described hereinbelow briefly hereinbelow.

(1) Air bleeding:
Air is introduced into the etchant bottle 11 by moving the plunger 19P downward with the valves MV1 and MV2 open and MV3 closed. Thereafter, air is removed into the neutralizer bottle 21 by moving the plunger 19P upward with the valves MV7 open and MV1 closed.

(2) Etchant feeding to reservoir:
A required amount of etchant is fed from the bottle 11 to the reservoir 25 by moving the plunger 19P first downward with MV2 open and MV3 closed and then downward with MV2 closed and MV3 open.

(3) Etchant feed to plastic mold device:
Etchant in the reservoir 25 is circulated by driving the gear pump 35 with the check valve CV open.

(4) Cleaning operation:
Etchant is fed in the same way from the bottle 11 to the holders 33A and 33B directly via the pipe 55 by moving the plunger 19P first downward with MV2 open and MV8 closed and then downward with MV2 closed and MV8 open.

(5) Waste etchant discharging:
Waste etchant in the reservoir 25 is discharged by moving the plunger 19S downward with MV4 open and with MV5 closed and then upward with MV4 closed and MV5 open. In synchronism with this first plunger pump operation, the second plunger pump 61 is operated to feed neutralizer within the bottle 21 to the spiral pipe 59 to neutralize the waste etchant.

Figure 2:
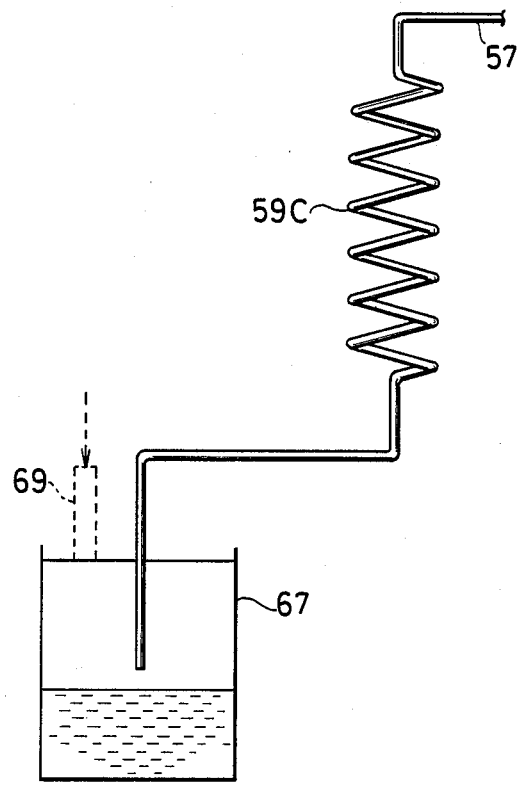
FIG. 2 is another diagrammatcal illustration for assistance in explaining another embodiment for neutralizing waste etchant.

FIG. 2 shows a second embodiment of the waste discharger. In this embodiment, a waste solution tank 67 is provided under the spiral pipe 59C.

In more detail, the second plunger 61 and the pipes 59 and 63 are all removed from the apparatus shown in FIG. 1, and the spiral pipe 59C is connected to only the pipe 57. Further, the water solution tank 67 is disposed under the pipe 59 to storage the waste solution. liquid or solid alkaline neutralizer mixed with water or only water is put into the tank 67. The waste solution fed through the spiral pipe 59C is dropped into the neutralizer or diluent in the tank 67 for neutralization.

Further, without putting neutralizer in the tank 67, it is also possible to connect another pipe 69 in order to feed neutralizer or diluent from the outside into the tank 67 for neutralization treatment.

What is claimed is:

1. A plastic mold decapsuling apparatus comprising:
   (a) an etchant bottle for containing an etchant to decapsule a capsuled plastic mold;
   (b) a heat tank for containing a heating medium kept at a constant temperature;
   (c) an etchant reservoir, disposed within said heat tank, for containing a predetermined amount of the heated etchant;
   (d) at least one decapsuling plastic mold holder for holding a plastic mold to be decapsuled;
   (e) first etchant feeding means for selectively feeding a predetermined amount of the etchant from said etchant bottle to said etchant reservoir and waste etchant from said decapsuling plastic mold holder to outside; and
   (f) second etchant feeding means, disposed within said heat tank, for circulating the etchant in said etchant reservoir through said decapsuling plastic mold holder.

2. The plastic mold decapsuling apparatus as set forth in claim 1, which further comprises:
   (a) a neutralizer bottle for containing a neutralizer for the etchant;
   (b) a pipe, connected to said first etchant feeding means, for discharging waste etchant; and
   (c) neutralizer feeding means for feeding a predetermined amount of the neutralizer in said neutralizer bottle to said spiral pipe to neutralize the waste etchant discharged through said spiral pipe.

3. The plastic mold decapsuling apparatus as set forth in claim 1, which further comprises a neutralization bottle for receiving waste etchant circulated by said first etchant feeding means and for neutralizing the waste etchant with a neutralizer put in said neutralization bottle.

4. The plastic mold decapsuling apparatus as set forth in claim 1, wherein said first etchant feeding means further comprises means for bleeding air from said etchant bottle.

5. The plastic mold decapsuling apparatus as set forth in claim 1, wherein said first etchant feeding means further comprises means for cleaning waste etchant attached to said decapsuling plastic mold holder.

6. The plastic mold decapsuling apparatus as set forth in claim 1, wherein said first etchant feeding means is a plunger pump.

7. The plastic mold decapsuling apparatus as set forth in claim 1, wherein said second etchant feeding means is a gear pump.

8. The plastic mold decapsuling apparatus as set forth in claim 1, wherein said second etchant feeding means is a plunger pump.

9. The plastic mold decapsuling apparatus as set forth in claim 1, which further comprises a spiral pipe connected between said etchant reservoir and said first etchant feeding means and disposed within the heating medium to effectively heat etchant fed to said etchant reservoir.

* * * * *